(12) United States Patent
Behrendt et al.

(10) Patent No.: US 7,088,137 B2
(45) Date of Patent: Aug. 8, 2006

(54) SYSTEM, METHOD AND PROGRAM PRODUCT FOR EXTENDING RANGE OF A BIDIRECTIONAL DATA COMMUNICATION BUS

(75) Inventors: Eileen M. Behrendt, Mahopac, NY (US); Jeffrey R. Biamonte, Hyde Park, NY (US); Raymond J. Harrington, Staatsburg, NY (US); Timothy M. Trifilo, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 70 days.

(21) Appl. No.: 10/838,391

(22) Filed: May 4, 2004

(65) Prior Publication Data

US 2005/0258865 A1 Nov. 24, 2005

(51) Int. Cl.
*H03K 19/173* (2006.01)
*G06F 13/00* (2006.01)

(52) U.S. Cl. .............................. 326/46; 326/86; 710/2; 710/300; 710/100; 710/305; 710/106

(58) Field of Classification Search .................. 326/86, 326/46
See application file for complete search history.

(56) References Cited

U.S. PATENT DOCUMENTS

| 4,254,501 | A |   | 3/1981  | Griffith et al. ................. 375/9 |
| 4,797,582 | A |   | 1/1989  | Nguyen et al. ............. 307/475 |
| 5,179,586 | A |   | 1/1993  | Lee ............................. 379/93 |
| 5,210,846 | A | * | 5/1993  | Lee ............................. 710/115 |
| 5,361,376 | A | * | 11/1994 | Cummins et al. ........... 710/305 |
| 5,587,824 | A |   | 12/1996 | Asprey ........................ 359/154 |
| 5,781,028 | A | * | 7/1998  | Decuir ......................... 326/30 |
| 6,014,040 | A | * | 1/2000  | Tracy ........................... 326/90 |
| 6,573,764 | B1 | * | 6/2003  | Taylor ......................... 327/108 |
| 6,621,323 | B1 | * | 9/2003  | Casper et al. ............... 327/379 |
| 6,639,423 | B1 | * | 10/2003 | Martin et al. ................. 326/30 |
| 6,703,866 | B1 | * | 3/2004  | Arimilli et al. ............... 326/86 |
| 2005/0165970 | A1 | * | 7/2005  | Ching et al. .................... 710/1 |

OTHER PUBLICATIONS

Barus, et al., "Method and System For Providing Bidirectional Asynchronous Communication", pending U.S. Appl. No. 10/668,488, filed Mar. 23, 2003.

* cited by examiner

*Primary Examiner*—Vibol Tan
(74) *Attorney, Agent, or Firm*—Lily Neff, Esq.; Kevin P. Radigan, Esq.; Heslin Rothenberg Farley & Mesiti, P.C.

(57) ABSTRACT

A communication system, method and program product are provided for establishing an extended bidirectional communication bus between a first device and a second device. The communication system includes decomposition logic for decomposing a single line, bidirectional data communication bus into a unidirectional transmit data communication bus and a unidirectional receive data communication bus. A differential communication subsystem is connected to the two unidirectional buses for extending the length thereof, and recomposition circuitry is connected to the differential communication subsystem for recombining the extended unidirectional transmit data communication bus and the extended unidirectional receive data communication bus to reestablish the single line, bidirectional data communication bus. The decomposition logic, differential communication subsystem and recomposition circuitry are implemented transparent to the first device and the second device and without use of a data direction control line.

22 Claims, 8 Drawing Sheets

| PRESENT STATE | | INPUTS | | NEXT STATE | |
|---|---|---|---|---|---|
| A | B | M | S | X | Y |
| 0 | 0 | 0 | 0 | 1 | 1 |
| 0 | 0 | 0 | 1 | 1 | 1 |
| 0 | 0 | 1 | 1 | 1 | 1 |
| 0 | 0 | 1 | 0 | 1 | 1 |
| 0 | 1 | 0 | 0 | 0 | 1 |
| 0 | 1 | 0 | 1 | 0 | 1 |
| 0 | 1 | 1 | 1 | 1 | 1 |
| 0 | 1 | 1 | 0 | 1 | 1 |
| 1 | 1 | 0 | 0 | 1 | 1 |
| 1 | 1 | 0 | 1 | 0 | 1 |
| 1 | 1 | 1 | 1 | 1 | 1 |
| 1 | 1 | 1 | 0 | 1 | 0 |
| 1 | 0 | 0 | 0 | 1 | 0 |
| 1 | 0 | 0 | 1 | 1 | 1 |
| 1 | 0 | 1 | 1 | 1 | 1 |
| 1 | 0 | 1 | 0 | 1 | 0 |

*fig. 4*

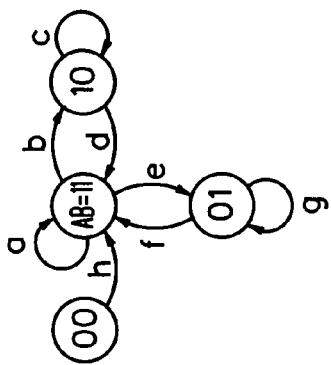

| TIME | EVENT | RESULT | TRANSITION TESTED |
|---|---|---|---|
| 0s | START | CLOCK RUNNING. INPUTS UNDEFINED. | |
| 52ns | MASTER DRIVES HIGH | SLAVE FOLLOWS HIGH ON NEXT CLOCK PULSE; STATE TRANSITIONS TO AB="11" | h |
| 102ns | MASTER DRIVES LOW | SLAVE FOLLOWS LOW ON NEXT CLOCK PULSE; STATE TRANSITIONS TO AB="01" | e |
| 152ns | MASTER DRIVES HIGH | SLAVE FOLLOWS HIGH ON NEXT CLOCK PULSE; STATE TRANSITIONS TO AB="11" | f |
| 175ns | MASTER RELEASES. | STATE REMAINS AT AB="11" | |
| 202ns | SLAVE DRIVES LOW | MASTER FOLLOWS LOW ON NEXT CLOCK PULSE; STATE TRANSITIONS TO AB="10" | b |
| 252ns | SLAVE DRIVES HIGH | MASTER FOLLOWS HIGH ON NEXT CLOCK PULSE; STATE TRANSITIONS TO AB="11" | d |
| 302ns | MASTER AND SLAVE DRIVE LOW | STATE REMAINS AT AB="11" | a |
| 352ns | MASTER AND SLAVE DRIVE HIGH | STATE REMAINS AT AB="11" | a |
| 375ns | SLAVE RELEASES. | STATE REMAINS AT AB="11" | |
| 402ns | MASTER DRIVES LOW | SLAVE FOLLOWS LOW ON NEXT CLOCK PULSE; STATE TRANSITIONS TO AB="01" | e |
| 452ns | SLAVE DRIVES HIGH | STATE REMAINS AT AB="01" | g |
| 475ns | SLAVE RELEASES. | SLAVE FOLLOWS LOW ON NEXT CLOCK PULSE; STATE REMAINS AB="01" | g |
| 552ns | MASTER AND SLAVE DRIVE HIGH | STATE TRANSITIONS TO AB="11" | f |
| 625ns | MASTER RELEASES. | STATE REMAINS AT AB="10" | |
| 652ns | SLAVE DRIVES LOW | MASTER FOLLOWS LOW ON NEXT CLOCK PULSE; STATE TRANSITIONS TO AB="10" | b |
| 702ns | MASTER DRIVES HIGH | STATE REMAINS AT AB="10" | c |
| 725ns | MASTER RELEASES. | MASTER FOLLOWS LOW ON NEXT CLOCK PULSE; STATE REMAINS AB="10" | c |
| 802ns | MASTER AND SLAVE DRIVE HIGH | STATE TRANSITIONS TO AB="10" | d | fig. 6

SYSTEM, METHOD AND PROGRAM PRODUCT FOR EXTENDING RANGE OF A BIDIRECTIONAL DATA COMMUNICATION BUS

CROSS REFERENCE TO RELATED APPLICATION

This application contains subject matter which is related to the subject matter of the following application, which is assigned to the same assignee as this application and which is hereby incorporated herein by reference in its entirety:

"Method and System For Providing Bidirectional Asynchronous Communication", Barus et al., Ser. No. 10/668,488 filed Mar. 23, 2003.

TECHNICAL FIELD

The present invention relates to data communication, and in particular, to a system, method and program product for providing an extended bidirectional communication bus between two devices. Embodiments of the invention use a state machine design that may be implemented, for example, using discrete logic or programmable logic devices.

BACKGROUND OF THE INVENTION

Existing complex programmable logic devices (CPLD), field programmable gate array (FPGA), and application specific integrated circuit (ASIC) technologies do not directly support implementation of internal bidirectional signals without the use of a dedicated direction control signal. Current architectures allow for I/O pins to be configured as bidirectional signals. However, these architectures do not allow for two of these pins to be directly tied together while maintaining a truly asynchronous bidirectional data path. The only existing solution to this unique problem is the introduction of a data direction control signal, which makes asynchronous bidirectional communication impossible.

A common method of implementing an asynchronous bidirectional half duplex communications link is the use of an open drain or open collector driver and a logic receiver at each end of the communications link which has a pull up resistor to a common voltage. It is possible for multiple devices to be connected to the same link. In the case of multiple devices on the same link, when one device talks, all other devices on the net receive the message. In this case, an agreed means of addressing is used so that an intended recipient knows the message is for him. At times it is desirable or necessary to isolate certain devices on such a link. This can arise because multiple devices may share the same address or there may not be enough addresses to accommodate the number of devices. Alternately it may be desirable to isolate a failing device from the link so that the failing device does not render the link inoperative. Many other instances arise where it is desirable to be able to inexpensively route and manipulate such communications links. Typically open drain and open collector communication links can be isolated, switched and routed using analog switches. Analog switches are large and expensive and this limits the complexity of the switching which can be easily achieved. Therefore, it is desirable to be able to switch and route such signals using logic gates which could reside on a CPLD, FPGA, ASIC or other highly integrated, inexpensive device.

As a further issue, a bidirectional data communication bus implemented on a single transmission line typically has a limited data communication range due to intrinsic capacitance established in the transmission line as the length increases. For example, Inter-Integrated Circuit ($I^2C$) communication is one example of a bidirectional data communication bus protocol for half duplex open collector communications. The protocol defines the maximum bus capacitive load to be 400 pF and the maximum rise time for the data signal to be 1 μs for $I^2C$ communications. This implies that the $I^2C$ bus cannot traverse great lengths without violating the specification. A rule of thumb used by many system designers is to maintain $I^2C$ bus lengths less than one meter. Therefore, a need exists in the art for an approach to extending range of a bidirectional data communication bus, such as a half duplex open collector communications bus implemented via a single data transmission line.

SUMMARY OF THE INVENTION

The shortcomings of the prior art are overcome and additional advantages are provided through a communication system for extending a range of a bidirectional data communication bus between a first device and a second device. The communication system includes decomposition logic for decomposing the bidirectional data communication bus into a unidirectional transmit data communication bus and a unidirectional receive data communication bus. A differential communication subsystem is connected to the unidirectional transmit data communication bus and the unidirectional receive data communication bus for providing extended unidirectional buses, and recomposition circuitry is connected to the differential communication subsystem for recombining the extended unidirectional transmit data communication bus and the extended unidirectional receive data communication bus into the bidirectional data communication bus.

In another aspect, a system is provided which includes a first device having a bidirectional first input/output pin and a second device having a bidirectional second input/output pin. The system further includes a communication system coupling the bidirectional first input/output pin with the bidirectional second input/output pin without a data direction control line therebetween. The communication system includes an extended range bidirectional data communication bus wherein a portion of the bidirectional data communication bus is decomposed into unidirectional transmit and receive data communication buses which are differentially driven employing a differential communication subsystem.

In a further aspect, a method for extending a range of a bidirectional data communication bus between a first device and a second device is provided. The method includes: decomposing the bidirectional data communication bus into a unidirectional transmit data communication bus and a unidirectional receive data communication bus; employing a differential communication subsystem to extend a length of the unidirectional transmit data communication bus and a length of the unidirectional receive data communication bus; and reestablishing the bidirectional data communication bus by recombining the extended unidirectional transmit data communication bus and the extended unidirectional receive data communication bus.

In the yet further aspect, at least one program storage device readable by a machine, tangibly embodying at least one program of instructions executable by the machine is provided to perform a method of extending a range of a bidirectional data communication bus between a first device and a second device. The method includes: decomposing the bidirectional data communication bus into a unidirectional transmit data communication bus and a unidirectional receive data communication bus; employing a differential communication subsystem to extend a length of the unidirectional transmit data communication bus and a length of the unidirectional receive data communication bus; and reestablishing the bidirectional data communication bus by recombining the extended unidirectional transmit data communication bus and the extended unidirectional receive data communication bus.

Further, additional features and advantages are realized through the techniques of the present invention. Other embodiments and aspects of the invention are described in detail herein and are considered a part of the claimed invention.

BRIEF DESCRIPTION OF THE DRAWINGS

The subject matter which is regarded as the invention is particularly pointed out and distinctly claimed in the claims at the conclusion of the specification. The foregoing and other objects, features, and advantages of the invention are apparent from the following detailed description taken in conjunction with the accompanying drawings in which:

FIG. 4 depicts an exemplary state transition table for the communication system of FIG. 1;

FIG. 6 depicts an exemplary sequence of events and corresponding state transitions;

BEST MODE FOR CARRYING OUT THE INVENTION

Figure 1:
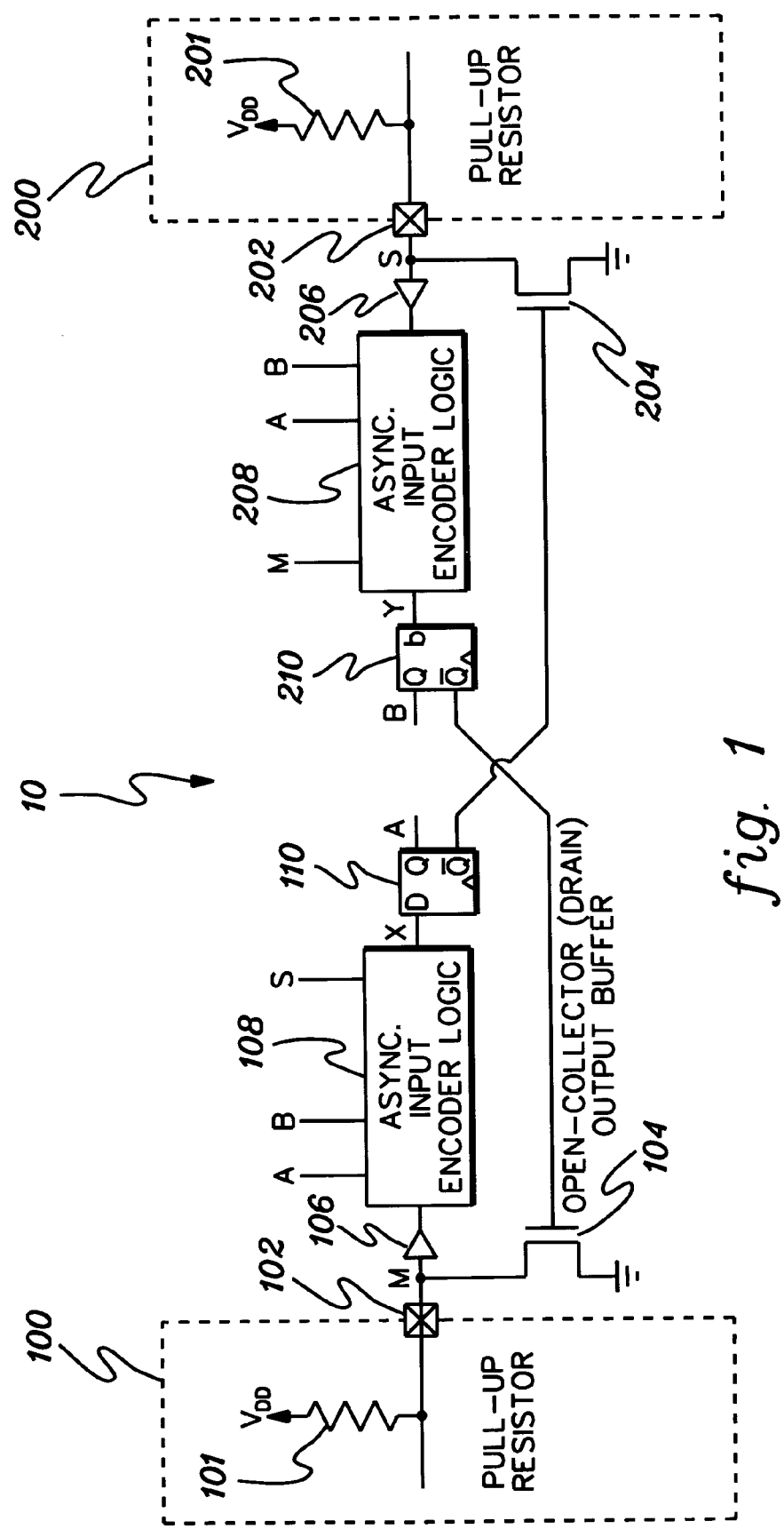
FIG. 1 depicts an exemplary bidirectional communication system between two devices.

FIG. 1 depicts an exemplary bidirectional communications system 10 between two devices, shown as first device 100 and second device 200. The designations first and second are for identification purposes only. The first and second designations do not indicate that one device has access priority to the communication bus or controls all communications between the two devices. Each device 100 and 200 includes a bidirectional input/output (I/O) pin 102 and 202, respectively. The input/output pins are pulled to logic high by pull-up resistors 101 and 201, respectively.

The communication system includes a first bus driver 104 and a second bus driver 204. The first signal M is provided to an input buffer 106 and then to first asynchronous encoder logic 108. The first asynchronous encoder logic 108 receives the first signal M, current first state A, current second state B and second signal S and generates a next first state X. The next first state X is provided to gate 110 (e.g., D flip flop) that outputs the next first state X as the current first state on the state machine clock. The current first state A is fed back as an input to the first asynchronous encoder logic 108 and second asynchronous encoder logic 208. Gate 110 also generates an inverted second drive signal which is provided to second bus driver 204. The second bus driver 204 connects the input/output pin 202 to ground and may be a switch element such as a BJT (i.e., in open collector configuration), FET (i.e., in open drain configuration), etc. The second drive signal activates second bus driver 204 that connects the input/output pin 202 to ground. As described in further detail herein, this corresponds to first device 100 sending a logic low to second device 200.

The second signal S is provided to an input buffer 206 and then to second asynchronous encoder logic 208. The second asynchronous encoder logic 208 receives the first signal M, current first state A, current second state B and second signal S and generates a next second state Y. The next second state Y is provided to gate 210 (e.g., D flip flop) that outputs the next second state Y as the current second state B on the state machine clock. Current second state B is fed back as an input to the first asynchronous encoder logic 108 and second asynchronous encoder logic 208. Gate 210 also generates an inverted first drive signal which is provided to first bus driver 104. The first bus driver 104 that connects the input/output pin 102 to ground and may be a switch element such as a BJT (i.e., in open collector configuration), FET (i.e., in open drain configuration), etc. The first drive signal activates first bus driver 104 connects the input/output pin 102 to ground. As described in further detail herein, this corresponds to second device 200 sending a logic low to first device 100.

Figure 2B:
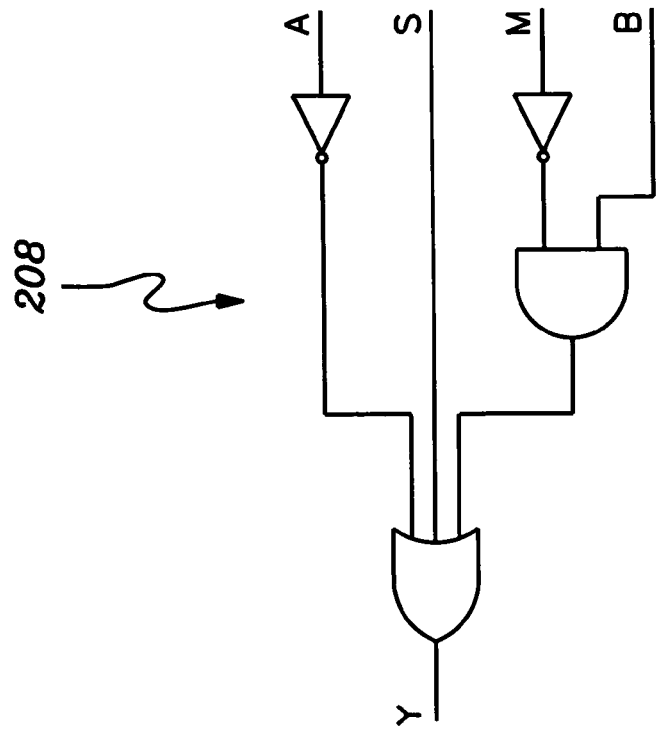
FIGS. 2A and 2B depict asynchronous encoder logic for first and second transceivers.
Figure 2A:
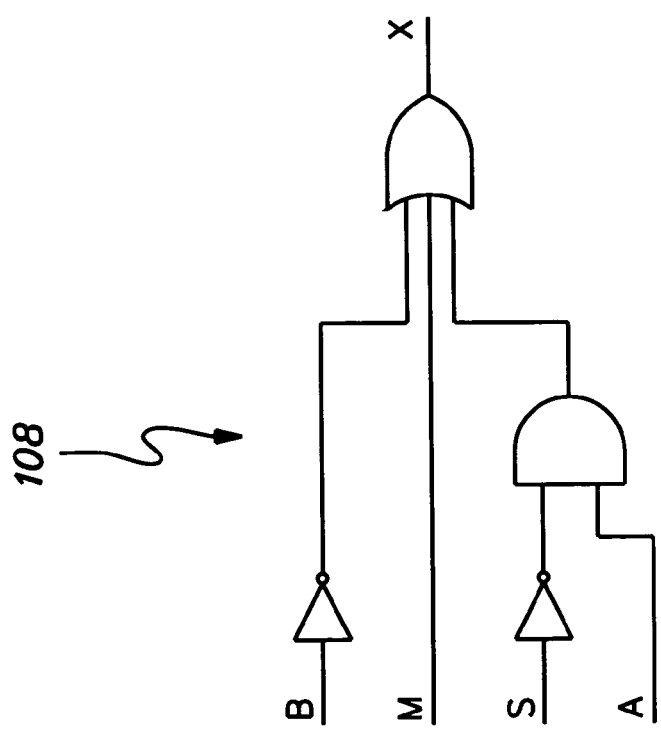

FIG. 2A depicts an exemplary embodiment for the first asynchronous encoder logic 108. The first asynchronous encoder logic 108 includes a number of logic gates that drive the next first state X. The various states and transitions are described in further detail with reference to FIG. 5. FIG. 2B depicts an exemplary embodiment for the second asynchronous encoder logic 208. The second asynchronous encoder logic 208 includes a number of logic gates that drive the next second state Y. The various states and transitions are described in further detail with reference to FIG. 5.

Figure 3:
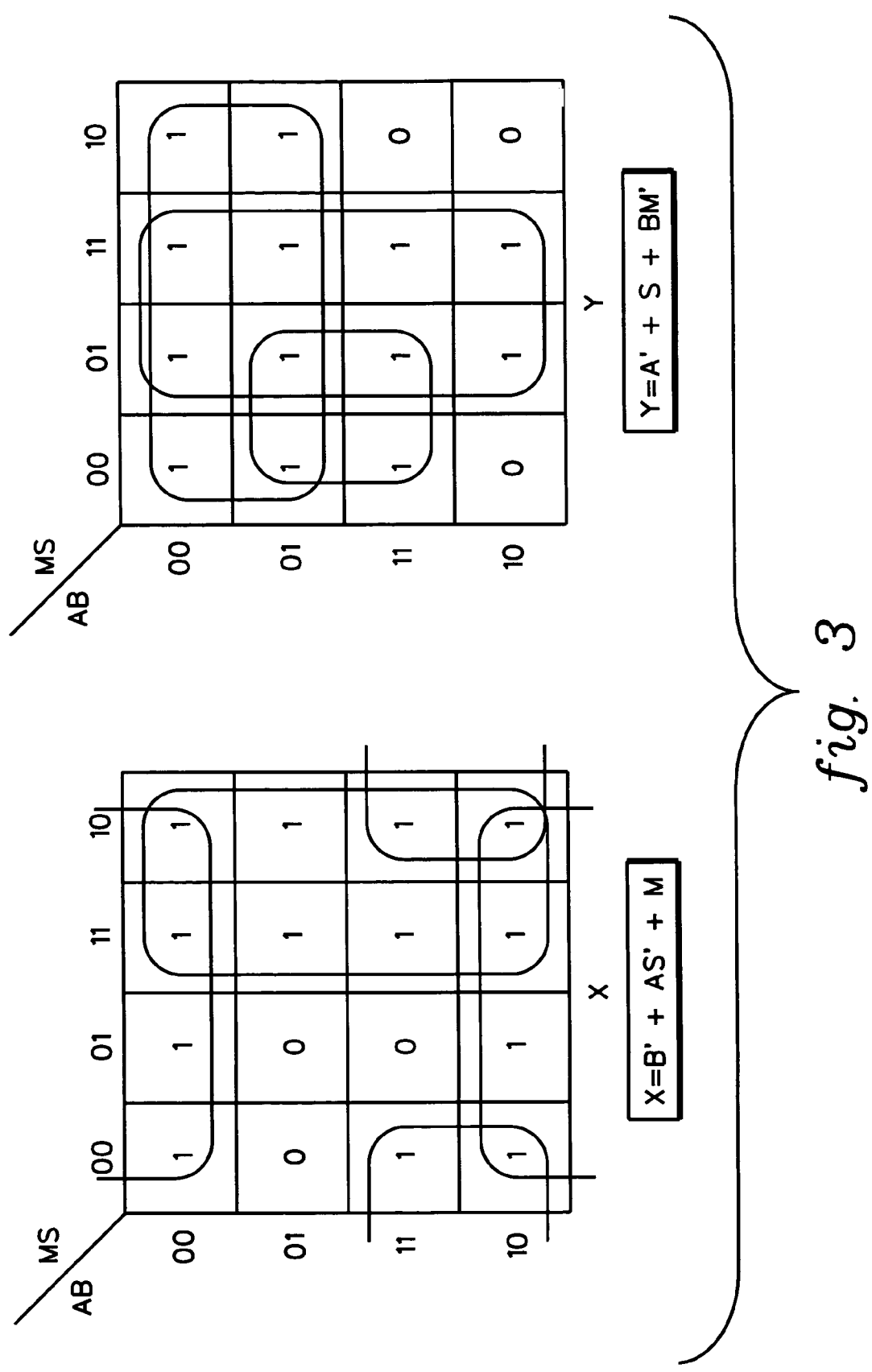
FIG. 3 depicts Karnaugh maps for the encoder logic.

FIG. 3 depicts Karnaugh maps used to develop the first encoder logic 108 and the second encoder logic 208. FIG. 4 depicts an exemplary state transition table for the communication system of FIG. 1.

In operation, either first device 100 or second device 200 desires to send data to the other device. To send data, the transmitting device drives input/output pin to a logic low which, when the system 10 is in the idle state, drives the input/output pin of the receiving device to a logic low. This initiates transmission of data from the transmitting device to the receiving device.

Figure 5:
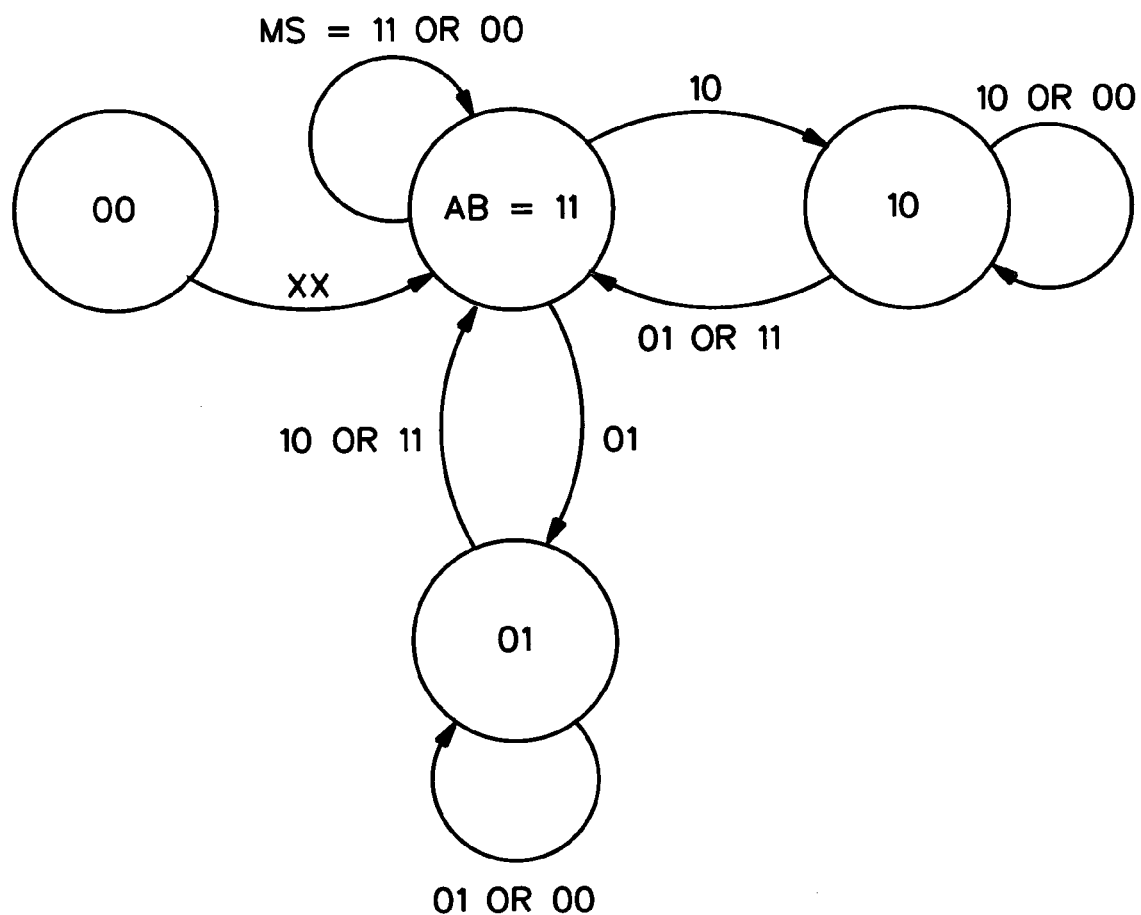
FIG. 5 depicts an exemplary state diagram for the communication system of FIG. 1.

FIG. 5 depicts an exemplary state diagram for the communication system 10 of FIG. 1. Upon initialization, the first state signal A and the second state signal B are both logic high and the state defaults to AB=11. This is the idle state and if first signal M and second signal S are both logic high (MS=11) this indicates that neither device is attempting to transmit to the other. If both first signal M and second signal S are logic low (MS=00), this indicates that both devices are attempting to transmit at the same time so the system 10 remains in the idle state. The MS=00 is considered a collision. The handling of collisions are protocol dependent.

If only the first device 100 is attempting to send data, the first device 100 drives the M signal to a logic low. The state transitions to AB=01 as shown in FIG. 5. Referring to FIG. 1, when in state AB=01, the value of not(A), the second drive signal for the second bus driver 204, is logic high thereby activating the second bus driver and pulling the second signal S to a logic low (ground). Also, the value of not(B), the first drive signal for the first bus driver 104, is logic low thereby deactivating the first bus driver 104 and it in a high impedance state, which allows for first device 100 to continue to pull second signal S to logic low. The system remains in state AB=01 and continues driving second signal S low until the first device 100 releases the bus, allowing the second signal to become a logic high.

To send a logic high from the first device 100 to the second device 200, the first device 100 releases the bus allowing the M signal to return to a logic high via pull up resistor 101. This results in the state transitioning to state AB=11 which in turn deactivates both bus drivers 104 and 204. The second signal S is no longer driven low, and returns to a logic high by virtue of pull up resistor 201. The first device 100 can continue sending logic low signals and logic high signals by driving the M signal as described above.

The second device 200 sends data to the first device 100 in a similar fashion. When the second device drives the S signal to a logic low, assuming the system state is AB=11, the system state transitions to state AB=10. The second device 200 sends logic low and logic high signals in a manner similar to that described above with reference to the first device 100. The second device 200 controls the first drive signals applied to first bus driver 104 to establish the value of the M signal.

Figure 7:
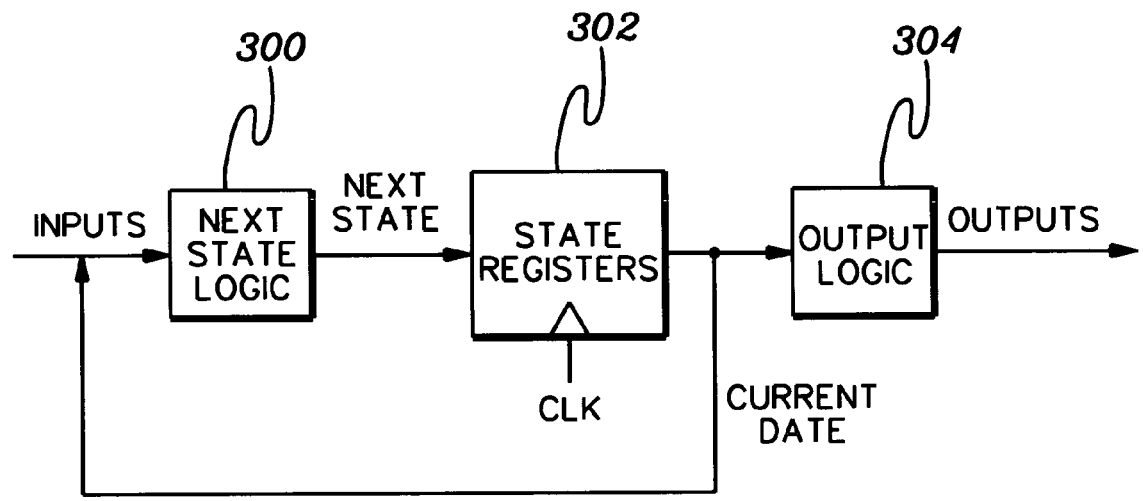
FIG. 7 is a high level block diagram of the state machine provided by the communication system of FIG. 1.

FIG. 6 shows a number of events and the corresponding changes in system state. As described above, either the first device 100 or the second device 200 initiates communication by driving the M signal or S signal, respectively, to a logic low. FIG. 7 is a high level block diagram of the communication system in an embodiment of the invention. As shown in FIG. 7, the current state is fed back as an input to the next state logic 300. This corresponds to the current first state A and current second state B being fed back to the first asynchronous encoder logic 108 and the second asynchronous encoder logic 208, respectively.

State registers 302 latch the next state as the current state and correspond to gates 110 and 210. The output logic 304 uses the current state information to generate the appropriate outputs. This corresponds to the inverted output on gates 110 and 210. The state machine provided by the communication system 10 provides the current state as a feedback directly to the input of the next state logic 300. This is contrasted with a typical Moore state machine. The communication system 10 provides synchronous feedback directly to the inputs of the combinational logic.

Communication system 10 enables asynchronous, half duplex, bi-directional communication without the use of a directional control line. Communication system 10 is also transparent to the first device 100 and second device 200 and autonomously determines the direction of communication. The first device 100 and second device 200 behave as if they are directly tied together by a copper wire. The communication system 10 may be implemented using individual logic elements, as part of an integrated circuit (such as a memory controller, serial communications multiplexor, or an interrupt arbitrator). The communication system 10 may also be as part of a larger system in a custom ASIC, FPGA, or CPLD. The communication system 10 provides a mechanism to separate the bidirectional signal into two unidirectional push-pull signals that can be routed and switched using standard logic gates. The system may also be used to create high level switching and routing functions such as multiplexors and demultiplexors.

Figure 8:
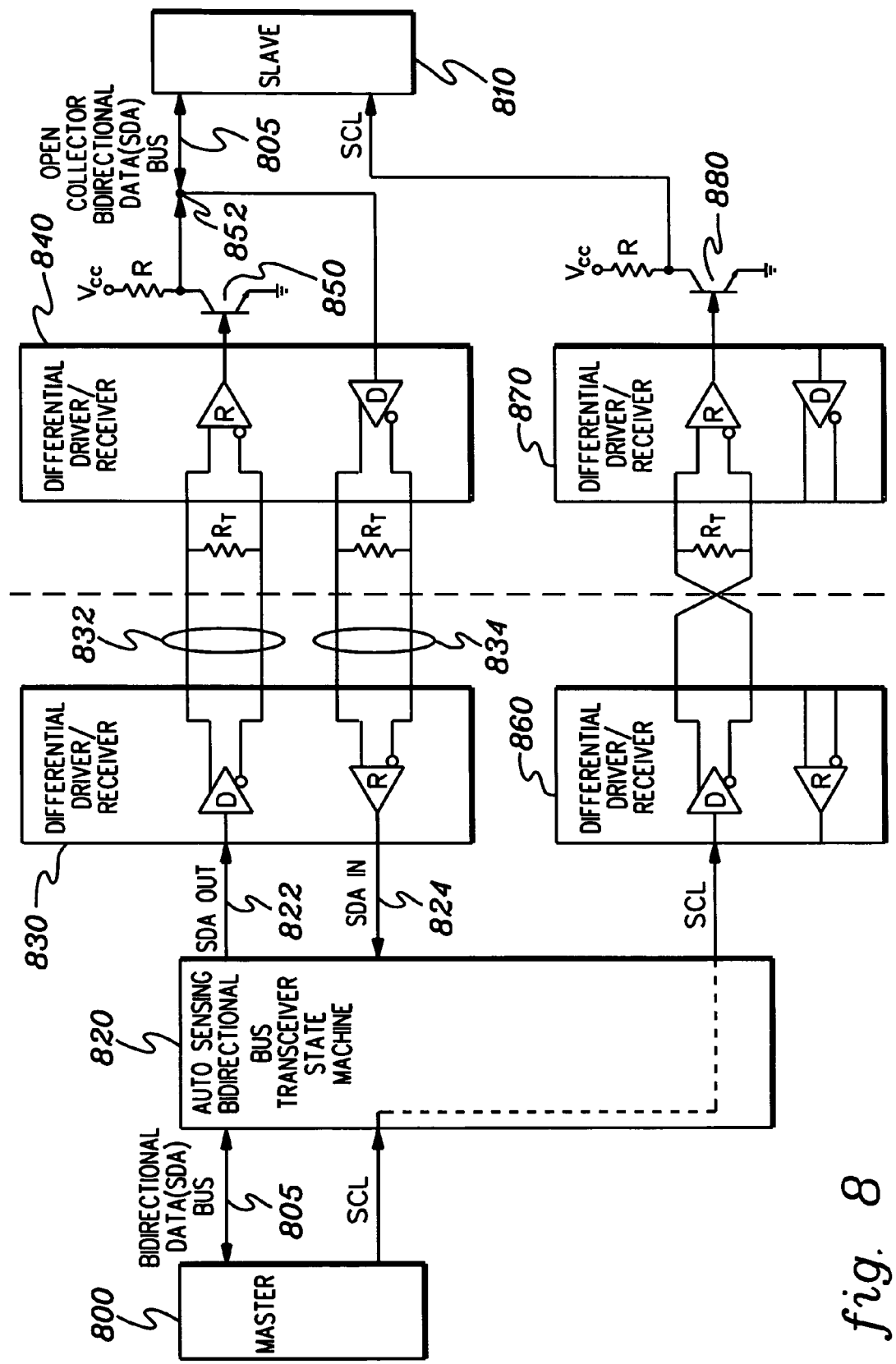
FIG. 8 is a block diagram of one embodiment of a communication system for extending range of a bidirectional data communication bus, in accordance with an aspect of the present invention.

The separation mechanism of communication system 10 can further advantageously be employed in an enhanced communication system which extends the range of a bidirectional data communication bus from that presently available. One embodiment of this enhanced communication system is depicted in FIG. 8.

As shown, a first device 800, such as a master device, is to communicate with a second device 810, for example, a slave device, employing a bidirectional data bus 805 which comprises a single line data transmission bus. In this example, bidirectional data bus 805 is broken into two portions with one embodiment of an enhanced communication system being inserted therebetween. Specifically, an autosensing bidirectional bus transceiver state machine 820 is employed adjacent to the first device 800 for separating the single line bidirectional communication bus into a unidirectional transmit data communication bus (serial data out (SDA OUT)) 822 and a unidirectional receive data communication bus (serial data in (SDA IN)) 824. Autosensing bidirectional bus transceiver state machine 820 can, in one example, comprise the communication system components described above in connection with FIGS. 1–7, i.e., those components disposed between first device 100 and second device 200 of FIG. 1. The two unidirectional communication buses can be obtained by, for example, decomposing the connection at point S from the drain/collector of transistor 204 to input buffer 206. Once so modified, transistor 204 functions as an output buffer for SDA OUT, while pin 202 and buffer 206 comprise the separate SDA IN line. Each line is tied to a separate unidirectional pin. By splitting the bidirectional bus into two unidirectional buses/pins, an ability is provided to differentially drive the signals in different directions.

A differential communication subsystem comprising multiple differential drivers/receivers 830, 840, 860 & 870 is employed to extend the length of the unidirectional transmit and receive data communication buses 822, 824. As shown, differential driver/receiver 830 includes a driver D which drives serial transmit data across a half duplex differential communication bus 832 to a receiver R disposed within differential driver/receiver 840. Resistance $R_T$ comprises a conventional termination resistance for the differential communication bus. Serial receive data from second device 810 is driven by a differential driver D within differential driver/receiver 840 across a second half duplex differential communication bus 834 to a receiver R within differential driver/receiver 830 for output as the SDA IN (on the unidirectional receive data communication bus 824).

At a distal end of the differential communication subsystem, the SDA OUT signal gates a transistor 850, which in this example, converts the transmit data communication to an open collector transmit data communication with its base tied to $V_{CC}$ across a resistor R. The SDA OUT communication and the SDA IN communication are recombined at a connect terminal 852 into, for example, an open collector bidirectional data bus 805, which is also connected to second device 810. Advantageously, state machine 820, the differential communication subsystem, and the recomposition circuitry are all transparent to first device 800 and second device 810, and there is no required data direction control bit or line. Consistent communication protocols are used throughout data transfers on the bidirectional data bus and the state machine a 820, differential communication subsystem and recomposition circuitry can be resident within the connection lines between the first device and the second device.

A unidirectional, serial clock signal (SCL) is also shown in FIG. 8. This clock signal is passed through (or around) the state machine 820 and is differentially driven by differential driver/receiver 860 and 870 in order to extend the length of the clock bus. Since the serial clock signal is assumed to comprise open collector in this example, a transistor 880 is employed at the output of the differential circuitry to recompose the clock signal as an open collector clock signal. Because transistor 880 functions to invert the clock signal, the clock line is shown inverted between differential driver/receiver 860 and differential driver/receiver 870. A similar inversion is not required in the data lines since the inversion is handled by the above-described state machine of FIGS. 1–7.

Those skilled in the art will note from the above description that provided herein is a system and method to extend the range of, for example, a half duplex open collector or open drain communication bus. Employing the state machine described in connection with FIGS. 1–7, a programmable logic device has the ability to allow for half duplex open collector or open drain communications to be implemented with a single line data transmission decomposed into a transmit communication bus and a receive communication bus. This takes full advantage of the architecture of programmable logic devices in that a bidirectional input/output buffer can be split as described herein into two pins, one being an input, the other serving as the output, and then simply wire dotting the pins further along the communications path to reestablish the bidirectional bus. Once the bidirectional communications bus is converted into a transmit communication bus and a receive communication bus, the opportunity arises to drive these buses differentially (with or without repeaters). This allows for a significant extension of the range of an open collector or open drain bus while providing sharp rise times, exceeding specifications such as the I²C protocol specification. This greatly enhances the potential of a half duplex bidirectional communications bus, allowing for noise immune transmissions over great lengths. The circuitry of the present invention could be implemented in a distributed fashion (e.g., FPGA, discrete components, transceivers), or be fabricated into a single integrated circuit solution.

Advantageously, the communication system disclosed herein allows a bidirectional communication bus to be differentially driven, which provides advantages of high noise immunity, sharp rise times, and greatly extended range capabilities. Common mode immunity is also achieved with this approach. Further, the implementation provides higher reliable communications in electrically noisy environments, and an ability to run half duplex open collector (or open drain) communications between, for example, server hardware in physically separate frames (increased range), and greatly reduce the required cost and complexity of the overall communications interface in a typical server by allowing for one master to communicate with slaves located further away, rather than requiring multiple masters to coordinate their communications at a higher level.

The present invention can be included in an article of manufacture (e.g., one or more computer program products) having, for instance, computer usable media. The media has embodied therein, for instance, computer readable program code means for providing and facilitating the capabilities of the present invention. The article of manufacture can be included as a part of a computer system or sold separately.

Additionally, at least one program storage device readable by a machine embodying at least one program of instructions executable by the machine to perform the capabilities of the present invention can be provided.

The flow diagrams depicted herein are just examples. There may be many variations to these diagrams or the steps (or operations) described therein without departing from the spirit of the invention. For instance, the steps may be performed in a differing order, or steps may be added, deleted or modified. All of these variations are considered a part of the claimed invention.

While the invention has been described with reference to an exemplary embodiment, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed as the best mode contemplated for carrying out this invention, but that the invention will include all embodiments falling within the scope of the appended claims.

What is claimed is:

1. A communication system for extending a range of a bidirectional data communication bus between a first device and a second device, the communication system comprising:
   decomposition logic for decomposing a bidirectional data communication bus into a unidirectional transmit data communication bus and a unidirectional receive data communication bus;
   a differential communication subsystem connected to the unidirectional transmit data communication bus and the unidirectional receive data communication bus for establishing an extended unidirectional transmit data communication bus and an extended unidirectional receive data communication bus; and
   recomposition circuitry connected to the differential communication subsystem for recombining the extended unidirectional transmit data communication bus and the extended unidirectional receive data communication bus into the bidirectional data communication bus.

2. The communication system of claim 1, wherein the decomposition logic, the differential communication subsystem, and the recomposition circuitry are transparent to the first device and the second device.

3. The communication system of claim 1, wherein the bidirectional data communication bus is a single line transmission bus.

4. The communication system of claim 1, wherein the extended unidirectional transmit data communication bus comprises a first differential communication bus and the extended unidirectional transmit data communication bus comprises a second differential communication bus.

5. The communication system of claim 4, wherein the differential communication subsystem further includes a first differential driver/receiver circuit connected to the first differential communication bus and the second differential communication bus at one end thereof and a second differential driver/receiver circuit connected to the first differential communication bus and the second differential communication bus at another end thereof, wherein the first differential driver/receiver circuit and the second differential driver/receiver circuit drive and receive serial data of the unidirectional transmit data communication bus and the unidirectional receive data communication bus across the first differential communication bus and the second differential communication bus, respectively.

6. The communication system of claim 1, wherein the decomposition logic comprises an autosensing bidirectional bus transceiver state machine for decomposing the bidirectional data communication bus into the unidirectional transmit data communication bus and the unidirectional receive data communication bus.

7. The communication system of claim 6, wherein the bidirectional data communication bus comprises one of an open collector communication bus and an open drain communication bus, and wherein the recomposition circuitry comprises a transistor circuit for reestablishing the open collector communication bus or the open drain communication bus by recombining the unidirectional transmit data communication bus and the unidirectional receive data communication bus.

8. The communication system of claim 1, wherein the first device comprises a master device and the second device comprises a slave device, and wherein the bidirectional data communication bus comprises a single line transmission bus employing one of an Inter-Integrated Circuit protocol, a System Management protocol and a Universal Asynchronous Receiver Transmitter protocol.

9. The communication system of claim 1, wherein the decomposition logic is disposed closer to the first device than the second device, and wherein the recomposition circuitry is disposed closer to the second device than the first device, and wherein the extended unidirectional transmit data communication bus comprises a half duplex transmit data communication bus and the extended unidirectional receive data communication bus comprises a half duplex receive data communication bus.

10. A system comprising:
a first device having a bidirectional first input/output pin;
a second device having a bidirectional second input/output pin;
a communication system coupling said bidirectional first input/output pin with said bidirectional second input/output pin without a data direction control line, said communication system comprising an extended range bidirectional data communication bus wherein a portion of the bidirectional data communication bus is decomposed into a unidirectional transmit data communication bus and a unidirectional receive data communication bus, each of which is separately differentially driven employing a differential communication subsystem.

11. A method for extending a range of a bidirectional data communication bus between a first device and a second device, the method comprising:
decomposing the bidirectional data communication bus into a unidirectional transmit data communication bus and a unidirectional receive data communication bus;
employing a differential communication subsystem to extend a length of the unidirectional transmit data communication bus and a length of the unidirectional receive data communication bus; and
reestablishing the bidirectional data communication bus by recombining the extended unidirectional transmit data communication bus and the extended unidirectional receive data communication bus.

12. The method of claim 11, wherein the decomposing, employing and reestablishing are transparent to the first device and the second device.

13. The method of claim 11, wherein the bidirectional data communication bus is a single line transmission bus.

14. The method of claim 11, wherein the extended unidirectional transmit data communication bus comprises a first differential communication bus and the extended unidirectional receive data communication bus comprises a second differential communication bus.

15. The method of claim 11, wherein the decomposing comprises employing an autosensing bidirectional bus transceiver state machine for decomposing, without use of a data direction control line, the bidirectional data communication bus into the unidirectional transmit data communication bus and the unidirectional receive data communication bus.

16. The method of claim 11, wherein the first device comprises a master device and the second device comprises a slave device, and wherein the bidirectional data communication bus comprises a single line transmission bus employing one of an Inter-Integrated Circuit protocol, a System Management protocol, and a Universal Asynchronous Receiver Transmitter protocol.

17. At least one program storage device readably by a machine, tangibly embodying at least one program of instructions executable by the machine to perform a method of extending a range of a bidirectional data communication bus between a first device and a second device, the method comprising:
decomposing the bidirectional data communication bus into a unidirectional transmit data communication bus and a unidirectional receive data communication bus;
employing a differential communication subsystem to extend a length of the unidirectional transmit data communication bus and a length of the unidirectional receive data communication bus; and
reestablishing the bidirectional data communication bus by recombining the extended unidirectional transmit data communication bus and the extended unidirectional receive data communication bus.

18. The at least one program storage device of claim 17, wherein the decomposing, employing and reestablishing are transparent to the first device and the second device.

19. The at least one program storage device of claim 17, wherein the bidirectional data communication bus is a single line transmission bus.

20. The at least one program storage device of claim 17, wherein the extended unidirectional transmit data communication bus comprises a first differential communication bus and the extended unidirectional receive data communication bus comprises a second differential communication bus.

21. The at least one program storage device of claim 17, wherein the decomposing comprises employing an autosensing bidirectional bus transceiver state machine for decomposing, without use of a data direction control line, the bidirectional data communication bus into the unidirectional transmit data communication bus and the unidirectional receive data communication bus.

22. The at least one program storage device of claim 17, wherein the first device comprises a master device and the second device comprises a slave device, and wherein the bidirectional data communication bus comprises a single line transmission bus employing one of an Inter-Integrated Circuit protocol, a System Management protocol, and a Universal Asynchronous Receiver Transmitter protocol.

* * * * *